(12) United States Patent
Lin et al.

(10) Patent No.: US 11,859,627 B2
(45) Date of Patent: Jan. 2, 2024

(54) FAN CONTROL SYSTEM AND METHOD THEREOF

(71) Applicant: ASUSTeK COMPUTER INC., Taipei (TW)

(72) Inventors: Hsin-Chen Lin, Taipei (TW); Ing-Jer Chiou, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 432 days.

(21) Appl. No.: 17/079,568

(22) Filed: Oct. 26, 2020

(65) Prior Publication Data

US 2021/0164482 A1 Jun. 3, 2021

(30) Foreign Application Priority Data

Dec. 2, 2019 (TW) .................................. 108143981

(51) Int. Cl.
*F04D 27/00* (2006.01)

(52) U.S. Cl.
CPC ........ *F04D 27/004* (2013.01); *F05D 2270/02* (2013.01); *F05D 2270/303* (2013.01); *F05D 2270/313* (2013.01); *F05D 2270/708* (2013.01)

(58) Field of Classification Search
CPC .............. F04D 27/004; F05D 2270/02; F05D 2270/303; F05D 2270/313; F05D 2270/708
See application file for complete search history.

(56) References Cited

U.S. PATENT DOCUMENTS

| 7,991,514 B2 | 8/2011 | Berenbaum et al. |
| 2018/0154303 A1* | 6/2018 | Giles ................... B01D 53/0454 |

FOREIGN PATENT DOCUMENTS

| CN | 100552233 C | 10/2009 |
| CN | 102253700 A | 11/2011 |

(Continued)

OTHER PUBLICATIONS

Machine Translation of CN-107882759-A PDF file Name: "CN107882759A_Machine_Translation.pdf".*

(Continued)

*Primary Examiner* — Grant Moubry
*Assistant Examiner* — Ruben Picon-Feliciano
(74) *Attorney, Agent, or Firm* — McClure, Qualey & Rodack, LLP

(57) ABSTRACT

A fan control system includes a fan, a first temperature sensor, a calculating unit, a logic controller, and a memory unit. The first temperature sensor continuously senses temperatures of a device during a time period, in order to obtain a plurality of sampled temperatures. The calculating unit selects N1 latest sampled temperatures and N2 latest sampled temperatures from the sampled temperatures, and calculates a first average temperature according to the N1 sampled temperatures and a second average temperature according to the N2 sampled temperatures. N1 and N2 are positive integers. The logic controller is configured to select one of the first average temperature and the second average temperature to output as a compensation temperature. The memory unit is configured to store an operating table, and configured to output a rotational speed control signal to the fan corresponding to the operating table according to the compensation temperature.

8 Claims, 3 Drawing Sheets

(56) References Cited

FOREIGN PATENT DOCUMENTS

| | | | | |
|---|---|---|---|---|
| CN | 107329509 A | * | 11/2017 | ............. G05D 23/30 |
| CN | 107882759 A | * | 4/2018 | ......... G05D 23/1917 |
| CN | 107949247 A | | 4/2018 | |
| TW | 200837522 A | | 9/2008 | |
| TW | M468696 U | | 12/2013 | |
| TW | M561828 U | | 6/2018 | |

OTHER PUBLICATIONS

Machine Translation of CN-107329509-A PDF file Name: "CN107329509A_Machine_Translation.pdf".*

* cited by examiner

FAN CONTROL SYSTEM AND METHOD THEREOF

CROSS-REFERENCE TO RELATED APPLICATION

This application claims the priority benefit of Taiwan Application Serial No. 108143981, filed on Dec. 2, 2019. The entirety of the above-mentioned patent application is hereby incorporated by reference herein and made a part of specification.

BACKGROUND OF THE INVENTION

Field of the Invention

The disclosure relates to a control system, and in particular, to a fan control system and the method thereof.

Description of the Related Art

As electronic devices are increasingly developed, heat dissipation modes as well as the mechanisms that use fans to control heat dissipation become increasingly complex.

BRIEF SUMMARY OF THE INVENTION

The disclosure provides a fan control system, including a fan, a first temperature sensor, a calculating unit, a logic controller, and a memory unit. The first temperature sensor continuously senses temperatures of a device during a time period, in order to obtain a plurality of sampled temperatures. The calculating unit selects N1 latest sampled temperatures and N2 latest sampled temperatures from the sampled temperatures, and calculates a first average temperature according to the N1 sampled temperatures and a second average temperature according to the N2 sampled temperatures. N1 and N2 are positive integers. The logic controller is configured to select one of the first average temperature and the second average temperature to output as a compensation temperature. The memory unit is configured to store an operating table, and configured to output a rotational speed control signal to the fan corresponding to the operating table according to the compensation temperature.

The disclosure further provides a fan control method, including the following steps: continuously sensing temperatures of a device during a time period, in order to obtain a plurality of sampled temperatures; selecting N1 latest sampled temperatures and N2 latest sampled temperatures from the sampled temperatures, and calculating a first average temperature according to the N1 sampled temperatures and a second average temperature according to the N2 sampled temperatures, where N1 and N2 are positive integers; selecting one of the first average temperature and the second average temperature according to a control signal to output as a compensation temperature; and adjusting a rotational speed of a fan according to the compensation temperature.

Based on the foregoing, in the disclosure, the calculating unit and the logic controller are used to correct and compensate for the sampled temperatures, so that the fan control system adjusts the rotational speed of the fan according to the single operating table in a plurality of different operating modes. In this way, space of storing operating tables for different operating modes is saved, and costs of the fan control system is reduced.

BRIEF DESCRIPTION OF THE DRAWINGS

The disclosure may be more fully understood by reading the following detailed description of the embodiments, and the accompanying drawings are as follows.

DETAILED DESCRIPTION OF THE EMBODIMENTS

The following makes detailed description by listing embodiments and with reference to the accompanying drawings, but the specific described embodiments are merely used to explain the embodiments of the disclosure, and are not intended to limit the embodiments of the disclosure. However, the description of structural operations is not intended to limit sequences in which the operations are performed, any structure in which elements are recombined and any device having equivalent functions shall fall within the scope covered by the content of the embodiments of the disclosure.

The term "coupled" or "connected" used in the specification may mean that two or more elements are in direct physical or electrical contact with each other or indirect physical or electrical contact with each other or two or more elements are in operation or action with each other.

Figure 1:
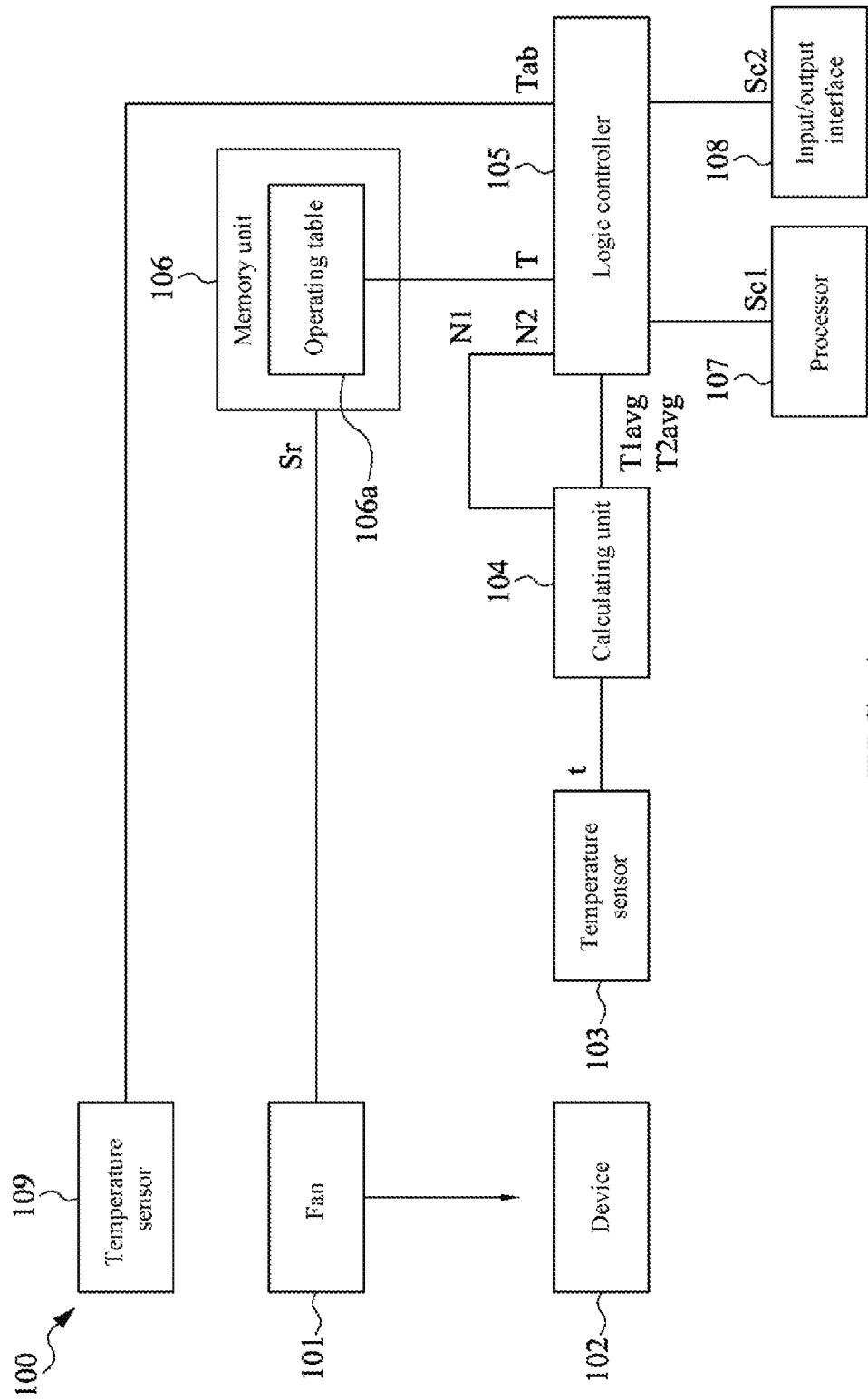
FIG. 1 is a schematic diagram of a fan control system according to some embodiments of the disclosure.

FIG. 1 is a schematic diagram of a fan control system 100 according to some embodiments of the disclosure. In some embodiments, the fan control system 100 is configured to adjust the temperature of a heat generation device, so that the temperature in the system is appropriate for operations of the device.

As shown in FIG. 1, the fan control system 100 includes a fan 101, a device 102, a temperature sensor 103, a calculating unit 104, a logic controller 105, a memory unit 106, a processor 107, an input/output interface 108, and a temperature sensor 109. The temperature sensor 103 is coupled to the calculating unit 104. The calculating unit 104 is coupled to the logic controller 105. The logic controller 105 is coupled to the memory unit 106. The memory unit 106 is coupled to the fan 101. The logic controller 105 is further separately coupled to the processor 107, the input/output interface 108, and the temperature sensor 109.

In some embodiments, the fan 101 is disposed near the device 102 to generate an air flow to adjust the temperature of the device 102.

In some embodiments, the device 102 is the heat generation device of which the temperature rises as a workload increases. When the air flow generated by the fan 101 flows near the device 102, the temperature of the device 102 decreases as the air flow carries away heat. In some embodiments, the device 102 is a central processing unit (CPU). In some other embodiments, the device 102 is a graphics processing unit (GPU).

In some embodiments, the temperature sensor 103 is disposed near the device 102, and is configured to sense the temperatures of the device 102. When the temperature of the device 102 increases as the workload increases, the temperature sensed by the temperature sensor 103 increases. In some embodiments, the temperature sensor 103 is further configured to continuously sense and continuously sample the temperatures of the device 102 in a time period, in order to obtain a plurality of sampled temperatures t, and transmit the sampled temperatures t to the calculating unit 104.

In some embodiments, the calculating unit 104 is configured to calculate an average value of the sampled temperatures t. The calculating unit 104 selects N1 latest sampled temperatures and N2 latest sampled temperatures from the sampled temperatures t, and performs calculation according to N1 and N2 separately. The calculating unit 104 calculates an average of the N1 latest sampled temperatures of the sampled temperatures t as a first average temperature T1$avg$, and calculates an average of the N2 latest sampled temperatures of the sampled temperatures t as a second average temperature T2$avg$. The calculating unit 104 is further configured to transmit the first average temperature T1$avg$ and the second average temperature T2$avg$ to the logic controller 105.

In some embodiments, N1 and N2 are positive integers. N1 is greater than 0, and N2 is greater than N1. In other words, when the calculating unit 104 calculates the first average temperature T1$avg$ and the second average temperature T2$avg$, the N1 latest sampled temperatures of the sampled temperatures t partially overlap the N2 latest sampled temperatures of the sampled temperatures t.

In an embodiment, at a moment, the temperature sensor 103 has sampled 100 temperatures t. When N1 is equal to 10 and N2 is equal to 50, the first average temperature T1$avg$ is an average value of the 10 latest sampled temperatures t of the 100 sampled temperatures, and the second average temperature T2$avg$ is an average value of the 50 latest sampled temperatures t of the 100 sampled temperatures.

In other words, it is assumed that the temperature sensor 103 has sampled the 100 sampled temperatures t1 to t100 in a time period, and the sampled temperatures t100 is the latest sampled temperature of the sampled temperatures. When N1 is equal to 10 and N2 is equal to 50, the first average temperature T1$avg$ is an average value of sampled temperatures t91 to t100, and the second average temperature T2$avg$ is an average value of sampled temperatures t51 to t100.

In some embodiments, the logic controller 105 is configured to select one of the first average temperature T1$avg$ and the second average temperature T2$avg$ to output as a compensation temperature T and transmit the compensation temperature T to the memory unit 106. As shown in FIG. 1, the memory unit 106 includes an operating table 106$a$. The operating table 106$a$ has information about a relationship between a temperature and a rotational speed of a fan. The memory unit 106 outputs a rotational speed control signal Sr to the fan 101 corresponding to the operating table 106$a$ according to the compensation temperature T to adjust a rotational speed of the fan 101. In some embodiments, when the compensation temperature T is higher, the rotational speed of the fan 101 corresponding to the rotational speed control signal Sr output by the memory unit 106 is faster.

In some embodiments, the logic controller 105 has a plurality of determination modes, and selects one of the first average temperature T1$avg$ and the second average temperature T2$avg$ according to the determination modes. In some embodiments, the determination mode includes: (a) selecting the first average temperature T1$avg$, (b) selecting the second average temperature T2$avg$, (c) selecting a larger one of the first average temperature T1$avg$ and the second average temperature T2$avg$, and (d) selecting a smaller one of the first average temperature T1$avg$ and the second average temperature T2$avg$.

In the determination mode (a), the logic controller 105 selects the first average temperature T1$avg$ to output as the compensation temperature T. In the determination mode (b), the logic controller 105 selects the second average temperature T2$avg$ to output as the compensation temperature T. Compared with the two modes, N1 is less than N2. Therefore, it can be learned that a quantity of sampled temperatures t is smaller, and consequently, the compensation temperature T selected by the determination mode (a) is more timely than the compensation temperature T selected by the determination mode (b). Compared with the determination mode (b), in the determination mode (a), the rotational speed control signal Sr output by the memory unit 106 enables the fan 101 to be quickly adjusted corresponding to the temperature of the device 102.

In some embodiments, when the rotational speed of the fan 101 is quickly adjusted, the temperature of the device 102 is also quickly adjusted, so that the temperature of the device 102 is maintained at an appropriate operating temperature, and consequently the efficiency is relatively high. In addition, because the rotational speed of the fan 101 is quickly adjusted, sound caused by the revolution of the fan 101 also changes quickly.

In some embodiments, when the rotational speed of the fan 101 is adjusted at a relatively slow speed, the temperature of the device 102 is also adjusted at a relatively slow speed, so that the sound caused by the fan 101 changes at a relatively slow speed.

In the determination mode (c), the logic controller 105 selects the larger one of the first average temperature T1$avg$ and the second average temperature T2$avg$ to output as the compensation temperature T. In this mode, when the temperatures of the device 102 quickly increase, the rotational speed of the fan 101 also quickly increases. Next, when the temperature of the device 102 decreases, the rotational speed of the fan 101 is still maintained at a relatively high rotational speed and does not quickly decrease in time, and eventually slows down.

Therefore, in the determination mode (c), the fan 101 has a function of adjusting the temperature of the device 102, and also has an effect of performing continuous heat dissipation for a high temperature that remains in the system after the temperature of the device 102 decreases. In an embodiment, when the temperature of the device 102 instantaneously increases, the first average temperature T1$avg$ is higher than the second average temperature T2$avg$. The logic controller 105 selects the first average temperature T1$avg$ to output as the compensation temperature T, so that the fan 101 has a relatively high rotational speed. Next, when the temperature of the device 102 starts to decrease, the first average temperature T1$avg$ decreases, but the second average temperature T2$avg$ is kept at a high temperature. The logic controller 105 selects the second average temperature T2$avg$ to output as the compensation temperature T, so that the fan 101 is kept at a relatively high rotational speed, and continuously enables the air flow to carry away remaining heat in the system.

In the determination mode (d), the logic controller 105 selects the smaller one of the first average temperature T1$avg$ and the second average temperature T2$avg$ to output as the compensation temperature T. In this mode, when the temperature of the device 102 quickly increases, the rotational speed of the fan 101 slowly increases instead of quickly increasing. When the temperature of the device 102 decreases, the rotational speed of the fan 101 quickly decreases.

Therefore, in the determination mode (d), the fan 101 has a time for reducing the generation of a large amount of sound change. In an embodiment, when the temperature of the device 102 instantaneously increases, the second average temperature T2*avg* is less than the first average temperature T1*avg*. The logic controller 105 selects the second average temperature T2*avg* to output as the compensation temperature T, so that the rotational speed of the fan 101 does not quickly increase. Next, when the temperature of the device 102 starts to decrease slowly, the first average temperature T1*avg* decreases, but the second average temperature T2*avg* is kept at a high temperature. The logic controller 105 selects the first average temperature T1*avg* to output as the compensation temperature T, so that the rotational speed of the fan 101 quickly decreases to reduce the time for reducing the generation of sound change.

In some embodiments, the processor 107 is configured to generate a control signal Sc1 to the logic controller 105. The logic controller 105 determines the determination modes according to the control signal Sc1, to select one of the first average temperature T1*avg* and the second average temperature T2*avg*.

In some embodiments, the input/output interface 108 is configured to transmit a control signal Sc2 external to the system to the logic controller 105. The logic controller 105 determines a determination mode according to the control signal Sc2, to select one of the first average temperature T1*avg* and the second average temperature T2*avg*. In some embodiments, a user may customize a determination mode and transmit the control signal Sc2 to the logic controller 105 through the input/output interface 108.

In some embodiments, the temperature sensor 109 is configured to sense an ambient temperature Tab, and transmit the ambient temperature Tab to the logic controller 105. The logic controller 105 determines a determination mode according to the ambient temperature Tab, to select one of the first average temperature T1*avg* and the second average temperature T2*avg*.

In some other embodiments, the logic controller 105 is configured to adjust N1 and N2 according to at least one of the control signal Sc1, the control signal Sc2, and the ambient temperature Tab. In an embodiment, when the ambient temperature Tab increases, the heat dissipation capability of the fan control system 100 decreases. Therefore, the logic controller 105 is configured to reduce N1 and N2, so that the rotational speed of the fan 101 changes in time, thereby improving the heat dissipation capability of the fan control system 100.

In some embodiments, the memory unit 106 includes a single temperature and rotational speed comparison table, that is, the operating table 106*a*. Regardless of a determination mode in which the logic controller 105 selects the first average temperature T1*avg* or the second average temperature T2*avg*, the logic controller 105 only needs to output the rotational speed control signal Sr corresponding to the compensation temperature T output by the logic controller 105. In some implementations, a heat dissipation system includes a plurality of rotational speed comparison tables, and each rotational speed comparison table corresponds to different working modes of the system. Therefore, a large amount of space is required to store the rotational speed comparison tables.

Compared with the foregoing implementations, in the embodiments of the disclosure, the fan control system 100 only includes the single operating table 106*a*. In different working modes, the calculating unit 104 and the logic controller 105 output the single compensation temperature T to the memory unit 106 after the sampled temperatures are appropriately corrected and compensated for. Therefore, even in different working modes, the fan control system 100 uses the single operating table 106*a* to complete different heat dissipation functions. Therefore, space of storing a plurality of operating tables for different operating modes is saved, and the cost of the fan control system 100 is reduced.

The arrangement of the fan control system 100 is only used for description. The arrangement of different fan control systems 100 falls within the consideration and the scope of the disclosure.

In some other embodiments, the fan control system 100 is a system configured to dissipate heat in a computer. The calculating unit 104, the logic controller 105, and the memory unit 106 are disposed in firmware such as an embedded controller (EC) in the computer. The processor 107 and the input/output interface 108 are connected to the logic controller 105 by a basic input/output system (BIOS) in the computer.

Figure 2:
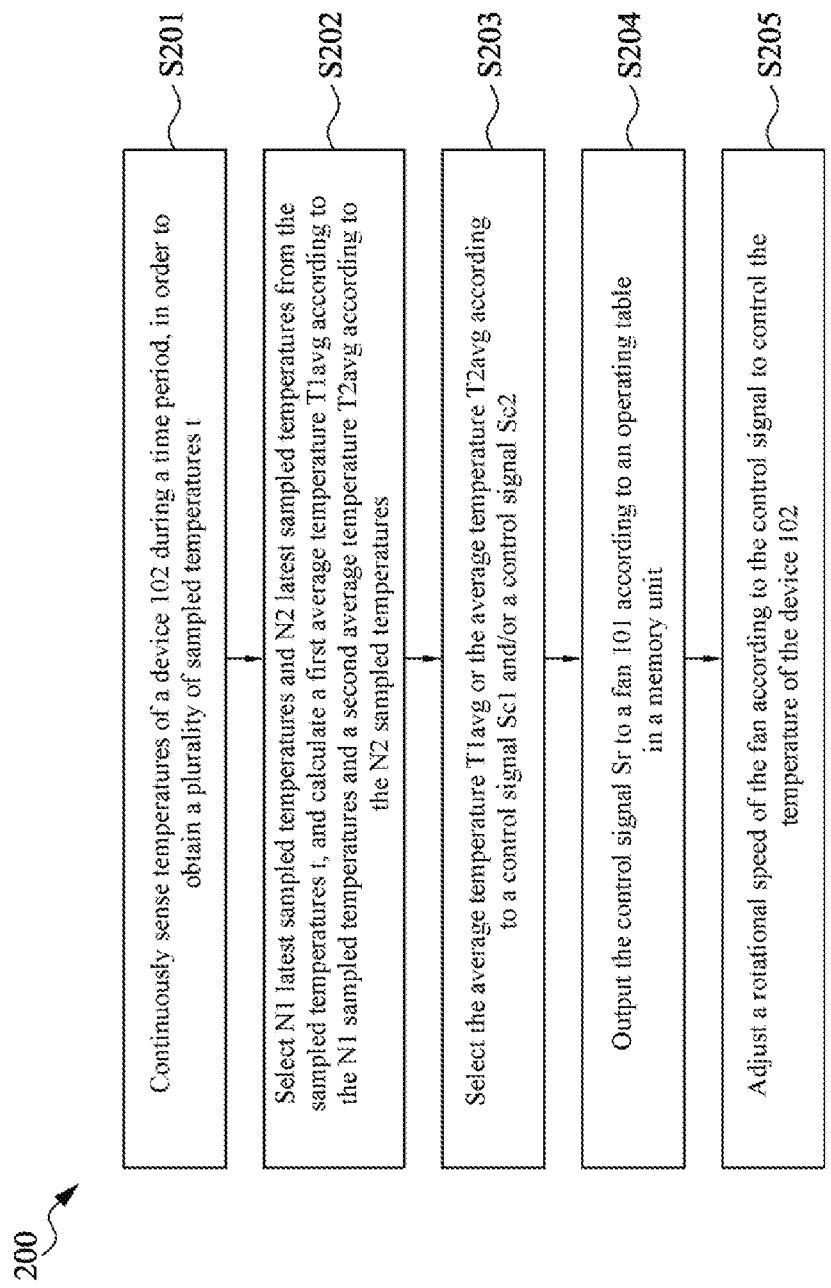
FIG. 2 is a flowchart of a fan control method according to some embodiments of the disclosure.

FIG. 2 is a flowchart of a fan control method 200 according to some embodiments of the disclosure. To better understand the content of the disclosure, FIG. 2 is discussed with reference to element and reference numerals in FIG. 1.

As shown in FIG. 2, the fan control method 200 includes steps S201, S202, S203, S204, and S205.

Step S201: The temperature sensor 103 continuously senses temperatures of the device 102 during a time period, in order to obtain a plurality of sampled temperatures t.

Step S202: The calculating unit 104 selects N1 latest sampled temperatures and N2 latest sampled temperatures from the sampled temperatures t, and calculates a first average temperature T1*avg* according to the N1 sampled temperatures and a second average temperature T2*avg* according to the N2 sampled temperatures. The first average temperature T1*avg* is an average value of the N1 latest sampled temperatures t of all the sampled temperatures t, and the second average temperature T2*avg* is an average value of the N2 latest sampled temperatures t of all the sampled temperatures t.

Step S203: The logic controller 105 selects one of the first average temperature T1*avg* and the second average temperature T2*avg* to output as a compensation temperature T and transmits the compensation temperature T to the memory unit 106. In some embodiments, the logic controller 105 further determines a determination mode according to at least one of the control signal Sc1 generated by the processor 107, the control signal Sc2 transmitted by the input/output interface 108, and the ambient temperature Tab sensed by the temperature sensor 109, to select one of the first average temperature T1*avg* and the second average temperature T2*avg* to output as the compensation temperature T. In some embodiments, step S203 further includes adjusting, by the logic controller 105, N1 and N2 according to the ambient temperature Tab.

Step S204: Output the rotational speed control signal Sr to the fan 101 according to the operating table 106*a* in the memory unit 106 and the compensation temperature T. The rotational speed control signal Sr enables the fan 101 to have a rotational speed corresponding to the compensation temperature T.

Step S205: The fan 101 adjusts a rotational speed according to the rotational speed control signal Sr to adjust and control the temperature of the device 102.

Descriptions of the fan control method 200 include exemplary steps, but the step sequence of the fan control method 200 is adjustable. That is, the sequence of the steps of the fan control method 200 is able to be changed in appropriate cases, the steps are performed simultaneously or some of the steps are performed simultaneously or omitted, which shall fall within the spirit and scope of the embodiments of the disclosure.

Figure 3:
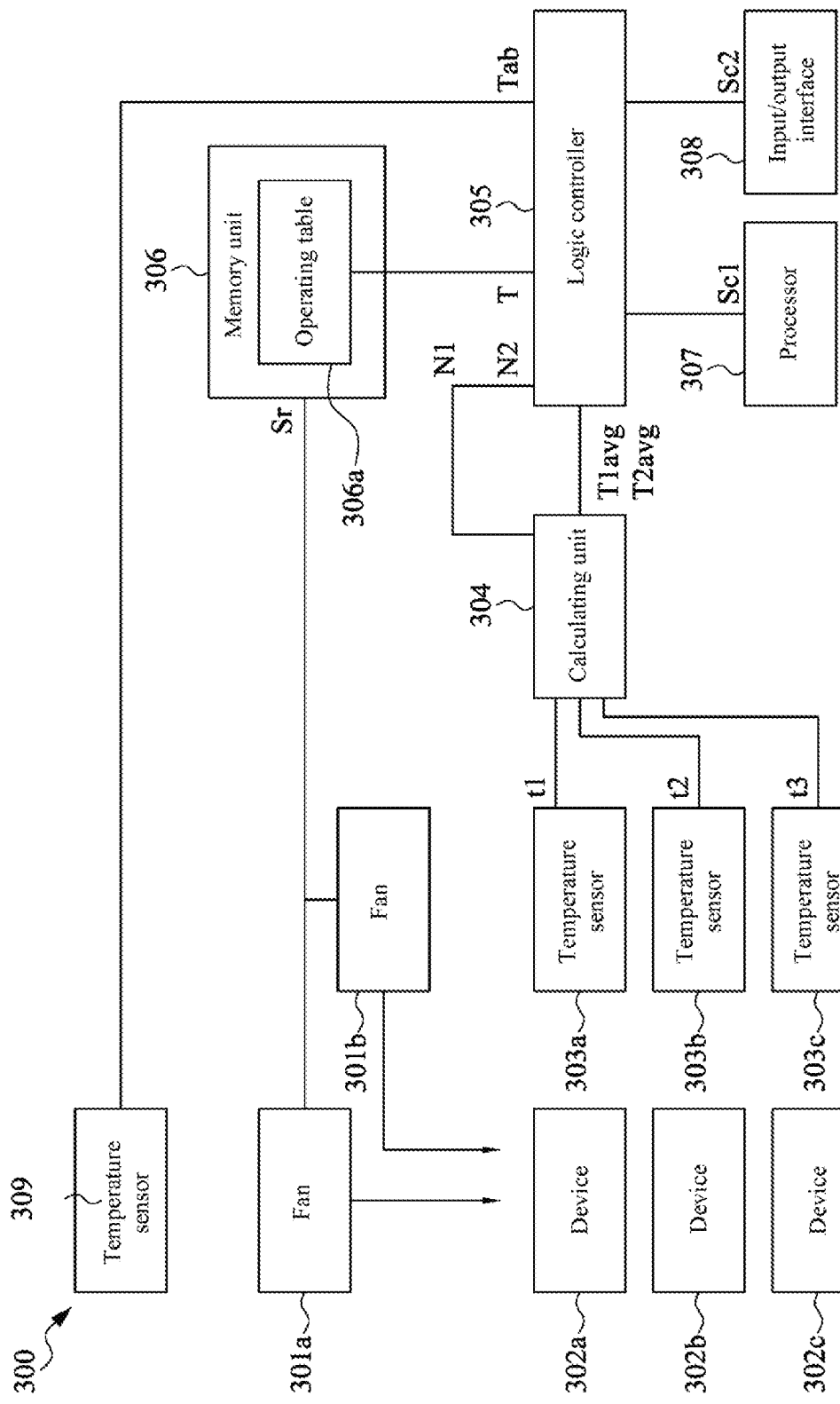
FIG. 3 is a schematic diagram of a fan control system according to some other embodiments of the disclosure.

FIG. 3 is a schematic diagram of a fan control system 300 according to some other embodiments of the disclosure. Compared with the fan control system 100 shown in FIG. 1, the fan control system 300 includes a plurality of fans, a plurality of devices, and a plurality of temperature sensors sensing temperatures of a device.

As shown in FIG. 3, the fan control system 300 includes fans 301a, 301b, devices 302a, 302b, 302c, temperature sensors 303a, 303b, 303c, a calculating unit 304, a logic controller 305, a memory unit 306, a processor 307, an input/output interface 308, and a temperature sensor 309.

The temperature sensors 303a, 303b, 303c are separately coupled to the calculating unit 304. The calculating unit 304 is coupled to the logic controller 305. The logic controller 305 is coupled to the memory unit 306. The memory unit 306 is coupled to the fans 301a, 301b. The logic controller 305 is further separately coupled to the processor 307, the input/output interface 308, and the temperature sensor 309.

In some embodiments, the fans 301a, 301b are disposed near the devices 302a, 302b, 302c to generate air flows to adjust the temperatures of the device 302a, 302b, 302c.

In some embodiments, the temperature sensors 303a, 303b, 303c are configured to sense the temperatures of the devices 302a, 302b, 302c respectively. When the temperatures of the devices 302a, 302b, 302c increase as the workload increases, the temperatures sensed by the temperature sensors 303a, 303b, 303c increase. In some embodiments, the temperature sensors 303a, 303b, 303c are further configured to sense and sample the temperatures of the devices 302a, 302b, 302c and transmit the sampled temperatures t1, t2, and t3 to the calculating unit 304.

In some embodiments, different elements include similar functions, such as the calculating unit 304 and the calculating unit 104, the logic controller 305 and the logic controller 105, the memory unit 306 and the memory unit 106, the operating table 306a and the operating table 106a, the processor 307 and the processor 107, the input/output interface 308 and the input/output interface 108, and the temperature sensor 309 and the temperature sensor. Details are not described herein again.

In some embodiments, when one of the fan 301a and the fan 301b fails, the heat dissipation capability of the fan control system 300 decreases. Therefore, the logic controller 305 reduces N1 and N2 to improve the heat dissipation capability of the fan control system 300, so that the rotational speed of a non-failed fan changes in time for responding to the temperatures of the devices 302a to 302c. When an abnormal fan is recovered, the heat dissipation capability of the fan control system 300 improves, so that the rotational speed of the fan responses to the temperatures of the devices 302a to 302c in time, and the logic controller 305 increases N1 and N2.

Quantities of the fans 301a and 301b, the devices 302a to 302c, and the temperature sensors 303a to 303c in the fan control system 300 are merely used for description. Different quantities of the fans, the devices, and the temperature sensors are all within the spirit and scope of the embodiments disclosed in the disclosure.

Based on the foregoing, in the disclosure, the calculating unit and the logic controller are used to correct and compensate for the sampled temperatures, so that the fan control system adjusts the rotational speed of the fan according to the single operating table in a plurality of different operating modes. In this way, space of storing operating tables for different operating modes is saved, and costs of the fan control system is reduced.

Although the embodiments of the disclosure have been disclosed above, the embodiments are not intended to limit the embodiments of the disclosure. A person skilled in the art may make variations and modifications without departing from the spirit and scope of the embodiments of the disclosure. Therefore, the protection scope of the embodiments of the disclosure should be subject to the appended claims.

What is claimed is:

1. A fan control system, comprising:
    a fan;
    a first temperature sensor, continuously sensing temperatures of a device during a time period and obtaining a plurality of sampled temperatures;
    a calculating circuit, selecting N1 latest sampled temperatures and N2 latest sampled temperatures from the sampled temperatures, and calculating a first average temperature according to the N1 sampled temperatures and a second average temperature according to the N2 sampled temperatures, wherein N1 and N2 are positive integers, the positive integer N1 is greater than 0, and the positive integer N2 is greater than the positive integer N1;
    a logic controller, configured to select one of the first average temperature and the second average temperature according to one of a plurality of determination modes to output as a compensation temperature, wherein the determination modes comprise:
    (a) selecting the first average temperature;
    (b) selecting the second average temperature;
    (c) selecting a larger one of the first average temperature and the second average temperature; and
    (d) selecting a smaller one of the first average temperature and the second average temperature; and
    a memory circuit, configured to store an operating table, and configured to output a rotational speed control signal to the fan corresponding to the operating table according to the compensation temperature.

2. The fan control system according to claim 1, further comprising:
    a second temperature sensor, configured to sense an ambient temperature, wherein
    the logic controller is further configured to adjust N1 and N2 according to the ambient temperature.

3. The fan control system according to claim 2, wherein the logic controller is further configured to select one of the first average temperature and the second average temperature according to the ambient temperature to output as the compensation temperature.

4. The fan control system according to claim 2, further comprising:
    a processor, configured to: generate a first control signal according to at least one of the temperatures and the ambient temperature, and transmit the first control signal to the logic controller, wherein
    the logic controller is further configured to select one of the first average temperature and the second average temperature according to the first control signal to output as the compensation temperature.

5. The fan control system according to claim 1, further comprising:
    an input/output interface, configured to transmit an external second control signal to the logic controller, wherein
    the logic controller is further configured to select one of the first average temperature and the second average temperature according to the second control signal to output as the compensation temperature.

6. A fan control method, comprising:
continuously sensing temperatures of a device during a time period to obtain a plurality of sampled temperatures;
selecting N1 latest sampled temperatures and N2 latest sampled temperatures from the sampled temperatures, and calculating a first average temperature according to the N1 sampled temperatures and a second average temperature according to the N2 sampled temperatures, wherein N1 and N2 are positive integers, the positive integer N1 is greater than 0, and the positive integer N2 is greater than the positive integer N1;
selecting one of the first average temperature and the second average temperature according to one of a plurality of determination modes to output as a compensation temperature, wherein the determination modes comprise:
(a) selecting the first average temperature;
(b) selecting the second average temperature;
(c) selecting a larger one of the first average temperature and the second average temperature; and
(d) selecting a smaller one of the first average temperature and the second average temperature; and
adjusting a rotational speed of a fan according to the compensation temperature.

7. The fan control method according to claim 6, further comprising:
sensing an ambient temperature; and
adjusting N1 and N2 according to the ambient temperature.

8. The fan control method according to claim 6, wherein the adjusting a rotational speed of a fan comprises:
outputting a rotational speed control signal to the fan according to the compensation temperature corresponding to an operating table stored in a memory circuit.

* * * * *